(12) United States Patent
Lin et al.

(10) Patent No.: US 6,878,610 B1
(45) Date of Patent: Apr. 12, 2005

(54) RELAXED SILICON GERMANIUM SUBSTRATE WITH LOW DEFECT DENSITY

(75) Inventors: Chun Chich Lin, Taichung (TW);
Yee-Chia Yeo, Albany, CA (US);
Chien-Chao Huang, Hsin-Chu (TW);
Chao-Hsiung Wang, Hsinchu (TW);
Tien-Chih Chang, Taipei (TW);
Chenming Hu, Alamo, CA (US);
Fu-Liang Yang, Hsin-Chu (TW);
Shih-Chang Chen, Taoyuan (TW);
Mong-Song Liang, Hsin-Chu (TW);
Liang-Gi Yao, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 10/228,545

(22) Filed: Aug. 27, 2002

(51) Int. Cl.[7] ......................... H01L 21/20; H01L 21/36
(52) U.S. Cl. ..................................................... 438/478
(58) Field of Search ......................................... 438/478

(56) References Cited

U.S. PATENT DOCUMENTS

| | | | | |
|---|---|---|---|---|
| 5,759,898 A | | 6/1998 | Ek et al. ...................... | 438/291 |
| 6,059,895 A | | 5/2000 | Chu et al. ................... | 148/33.1 |
| 6,291,321 B1 | | 9/2001 | Fitzgerald .................... | 438/494 |
| 6,313,016 B1 | * | 11/2001 | Kibbel et al. ................ | 438/478 |
| 6,323,108 B1 | | 11/2001 | Kub et al. .................... | 438/458 |
| 6,331,445 B1 | * | 12/2001 | Janz et al. ..................... | 438/57 |
| 6,559,471 B2 | * | 5/2003 | Finder et al. .................. | 257/22 |
| 6,590,236 B1 | * | 7/2003 | El-Zein et al. ............... | 257/201 |

FOREIGN PATENT DOCUMENTS

EP 000515859 A1 * 4/1992 ........... H01L/29/14

OTHER PUBLICATIONS

Z. Yang et al., "In Situ Relaxed Si1–xGex Epitaxial Layers with Low Threading Dislocation Densities Grown on Compliant Si–On–Insulator Substrates," J. Vac. Sci. Technol. B 16(3), May/Jun., 1998, pp. 1489–1491.

Rim et al., "Fabrication and Analysis of Deep Submicron Strained–Si N–MOSFET's, " IEEE Trans. on Electron Devices, vol. 47, No. 7, Jul. 2000, pp. 1406–1415.

* cited by examiner

Primary Examiner—David S. Blum
(74) Attorney, Agent, or Firm—Haynes and Boone, LLP

(57) ABSTRACT

A method of forming a strained silicon layer on a relaxed, low defect density semiconductor alloy layer such as SiGe, has been developed. In a first embodiment of this invention the relaxed, low density SiGe layer is epitaxially grown on an silicon layer which in turn is located on an underlying SiGe layer. During the epitaxial growth of the overlying SiGe layer defects are formed in the underlying silicon layer resulting in the desired, relaxation, and decreased defect density for the SiGe layer. A second embodiment features an anneal procedure performed during growth of the relaxed SiGe layer, resulting in additional relaxation and decreased defect density, while a third embodiment features an anneal procedure performed to the underlying silicon layer prior to epitaxial growth of the relaxed SiGe layer, again allowing optimized relaxation and defect density to be realized for the SiGe layer. The ability to obtain a strained silicon layer on a relaxed, low defect density SiGe layer, allows devices with enhanced carrier mobility to be formed in the surface of the strained silicon layer, with decreased risk of leakage due the presence of the underlying, relaxed, low defect density SiGe layer.

10 Claims, 5 Drawing Sheets

RELAXED SILICON GERMANIUM SUBSTRATE WITH LOW DEFECT DENSITY

BACKGROUND OF THE INVENTION (1) Field of the Invention

The present invention relates to methods used to fabricate semiconductor devices, and more specifically to a method used to form a strained silicon layer to accommodate a channel region for a metal oxide semiconductor field effect transistor (MOSFET) device.

(2) Description of Prior Art

A promising method for improving MOSFET device performance is enhancement of carrier mobility. Both hole and electron mobility enhancement can be accomplishment via the employment of surface channel, tensile strained silicon layers. Strained silicon layers used for MOSFET channel regions have been formed via epitaxial growth of silicon on relaxed silicon germanium (SiGe) pseudo substrates. Good film quality of strained silicon layers, and of relaxed SiGe layers, are important factors for enhanced performance of strained silicon MOSFET devices, however substrate layers exhibiting high defect density, in terms of dislocations, stacking faults, twins, etc., will reduce carrier mobility.

A high quality relaxed SiGe layer, to be subsequently overlaid by a strained silicon layer, can be produced via the use of a thick SiGe buffer layer deposited on an underlying semiconductor substrate. However there are several disadvantages to the growth of a thick SiGe buffer layer. First, a thick SiGe buffer layer at a thickness greater than a micrometer negatively impacts throughput adding unwanted processing costs. Secondly, the defect density of thick SiGe layers can be as high as 1E7 defects/$cm^2$. The use of a thick SiGe buffer layer on a silicon on insulator (SOI) substrate, does allow defect densities to be decreased, however still in the unacceptable range of about 1E6 defects/$cm^2$.

This invention will feature a method of obtaining a desired, strained silicon layer on a relaxed, low defect density semiconductor alloy layer, an alloy layer such as a SiGe layer. This is accomplished via the growth of the strained silicon layer on an underlying composite layer which in turn is comprised of a silicon layer sandwiched between two strained layers, such as SiGe layers. As the thickness of the top SiGe strained layer of the composite layer increases via epitaxial growth, dislocations form in the sandwiched, initially unstrained silicon layer, allowing the top, or overlying initially strained alloy layer to relax, and exhibit a low defect density. The desired strained silicon layer is now epitaxially grown on the underlying, relaxed semiconductor alloy layer. A key advantage of this invention is the low dislocation density in the relaxed SiGe layer, underlying the strained silicon layer. Prior art such as Chu et al, in U.S. Pat. No. 6,059,895, as well as Ek et al, in U.S. Pat. No. 5,759,898, describe methods of forming tensile strained silicon layers via SiGe relaxed layers, however these prior arts do not describe the novel process sequence disclosed in this present invention in which a strained silicon layer is formed on a relaxed, low defect density, semiconductor alloy layer.

SUMMARY OF THE INVENTION

It is an object of this invention to form a strained silicon layer, for use as a channel region for a MOSFET device.

It is another object of this invention to form a composite layer comprised of a silicon layer, sandwiched between strained SiGe layers, and with increasing growth of the top SiGe layer create defects in the underlying silicon layer, while converting the overlying, strained SiGe layer to a relaxed, low defect density SiGe layer.

It is another object of this invention to grow a strained silicon layer on the underlying composite layer, with the strained silicon layer grown on the relaxed, low defect density SiGe layer.

In accordance with the present invention a method of forming a strained silicon layer on a relaxed, low defect density semiconductor alloy layer, for use as a channel region for a MOSFET device is described. After growth of an underlying strained layer, such as a silicon—germanium (SiGe) layer, on a semiconductor or on an SOI substrate, an unstrained silicon layer is epitaxially grown, followed by epitaxial growth of an overlying strained layer, such as a SiGe layer. As the thickness of the overlying, strained SiGe layer increases strain is induced in the underlying silicon layer via dislocation formation, resulting in a strained silicon layer, while relaxing the strain, and lowering the defect density of the overlying SiGe layer. A strained silicon layer is then epitaxially grown on the underlying, relaxed low defect density SiGe layer.

BRIEF DESCRIPTION OF THE DRAWINGS

The object and other advantages of this invention are best described in the preferred embodiment with reference to the attached drawings that include.

DESCRIPTION OF THE PREFERRED EMBODIMENTS

Figure 1:
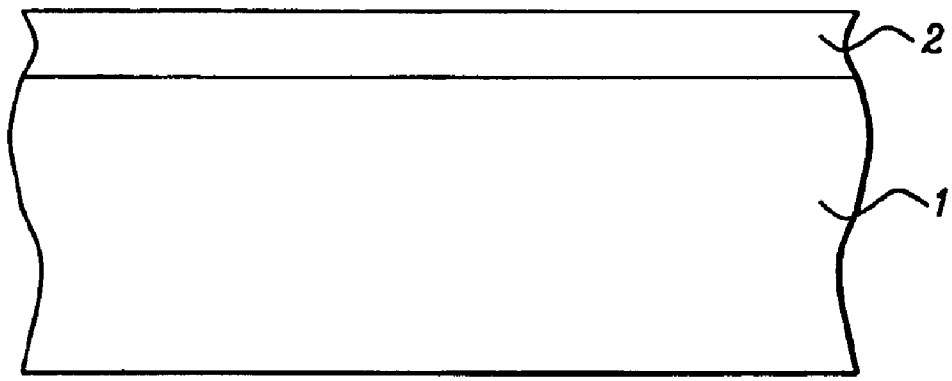
FIGS. 1–5, which schematically, in cross-sectional style, describe key stages of fabrication for obtaining a strained silicon layer on an underlying composite layer, wherein the overlying component of the composite layer is a relaxed, low defect density semiconductor alloy layer.

A method of forming a strained silicon layer on a relaxed, low defect density semiconductor alloy layer, such as SiGe, silicon layer, will now be described in detail. Substrate 1, schematically shown in FIG. 1, can be a semiconductor substrate such as a single crystalline, silicon substrate, or substrate 1, can be a silicon on insulator (SOI), substrate. Strained layer 2, a semiconductor alloy layer such as SiGe, is epitaxially grown on substrate 1, via chemical vapor deposition (CVD), or via molecular beam epitaxy, to a thickness below the critical thickness. Strained layer 2, is epitaxially grown using silane, or disilane as a silicon source, while germane is used as the germanium source. Strained layer 2, is kept thin, less than the critical thickness, so that relaxation of this layer does not occur. Strained layer 2, is formed with a natural lattice constant different than the lattice constant of semiconductor substrate 1.

Figure 2:
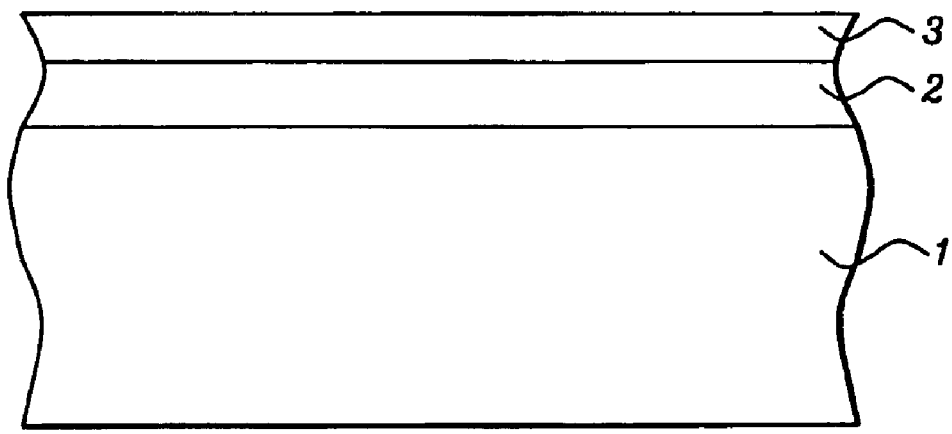

Silicon layer 3, is next epitaxially grown on strained layer 2, to a thickness less than 500 Angstroms. Silicon layer 3, schematically shown in FIG. 2, is epitaxially grown using silane or disilane as a source. Silicon layer 3, is grown with a natural lattice constant different than the natural lattice constant of strained layer 2.

Figure 3:
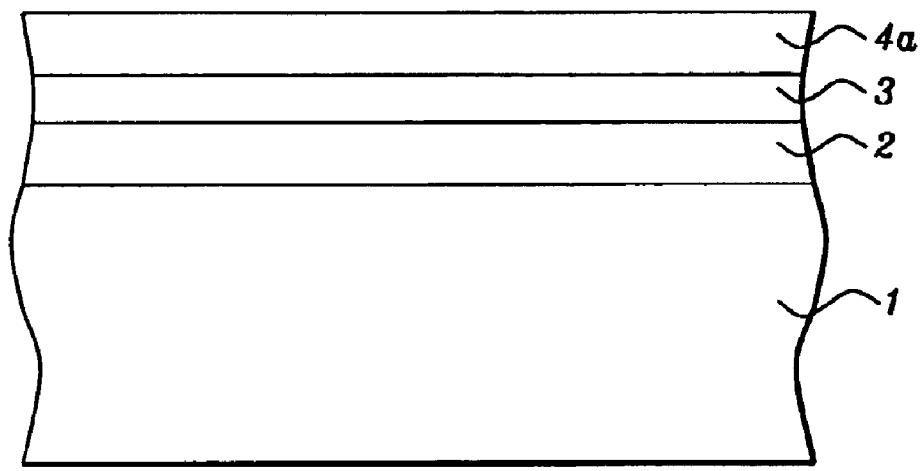
Figure 4:
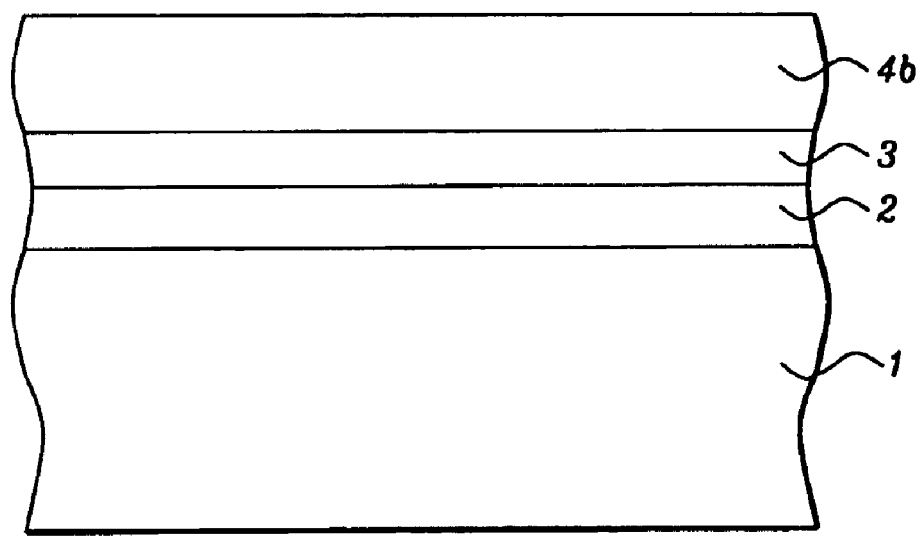

Growth of another semiconductor layer is next addressed, attempting to obtain a relaxed, low defect density layer. A first stage of obtaining a relaxed, low defect density layer initiates with a first stage of an epitaxial growth procedure, resulting in the epitaxial growth of thin strained layer 4a, wherein the thin strained layer is a semiconductor layer 4a, such as SiGe layer, and wherein the content of germanium in semiconductor layer 4a, is between about 5 to 80 weight percent. Thin, strained layer 4a, is again obtained via molecular beam epitaxy or via chemical vapor deposition featuring metal organic CVD procedures using silane, or disilane as a source for silicon, while germane is used as a source for germanium. This is schematically shown in FIG. 3. As the thickness of the overlying strained layer increases during a second stage of the epitaxial growth procedure, strain is induced in the underlying, initially unstrained silicon layer 3. When the strain in silicon layer 3, causes its critical thickness to decrease below its physical thickness, dislocations in silicon layer 3, will ensue converting initially unstrained silicon layer 3, to a strained silicon layer. In addition, and of upmost importance, the dislocation formation in strained silicon layer 3, results in relaxation of overlying strained layer 4a, resulting in a relaxed SiGe layer 4b, now at a final thickness between about 4000 Angstroms to several um. The natural lattice constant of SiGe layer 4b, is different than the natural lattice constant of underlying silicon layer 3. The result of the epitaxial growth is schematically shown in FIG. 4. Thus the desired feature of forming a relaxed, low density layer, such as relaxed, low density semiconductor alloy layer 4b, is achieved, with this relaxed SiGe layer 4b, now providing a defect density of less than 1 E3 defects 1 cm2. The low defect density of layer 4b, which will subsequently be located underlying a strained silicon layer, will minimize the leakage path for subsequent MOSFET devices formed in a subsequently overlying strained silicon layer.

Figure 5:
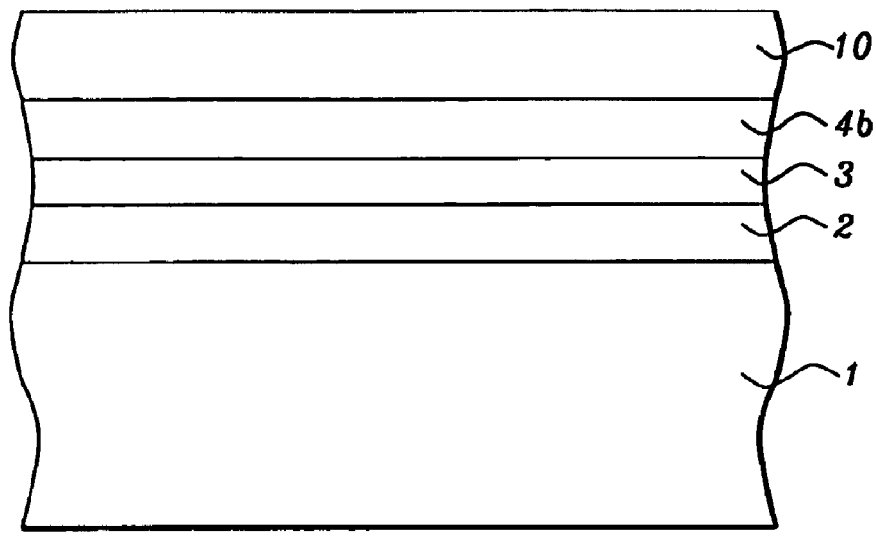

Critical, silicon layer 10, the desired layer to be used to accommodate the channel region for subsequent CMOS devices, is next epitaxially grown, and schematically shown in FIG. 5. Silicon layer 10, is epitaxially grown using silane or disilane as a source. The thickness of silicon layer 10, is less than it's critical thickness to maintain the desired strain in silicon layer 10. Thus the desired configuration needed to accommodate high performance, low leakage MOSFET devices, a strained silicon layer, on an underlying, relaxed low defect density layer, has been achieved via use of the above first embodiment of the invention.

Figure 6:
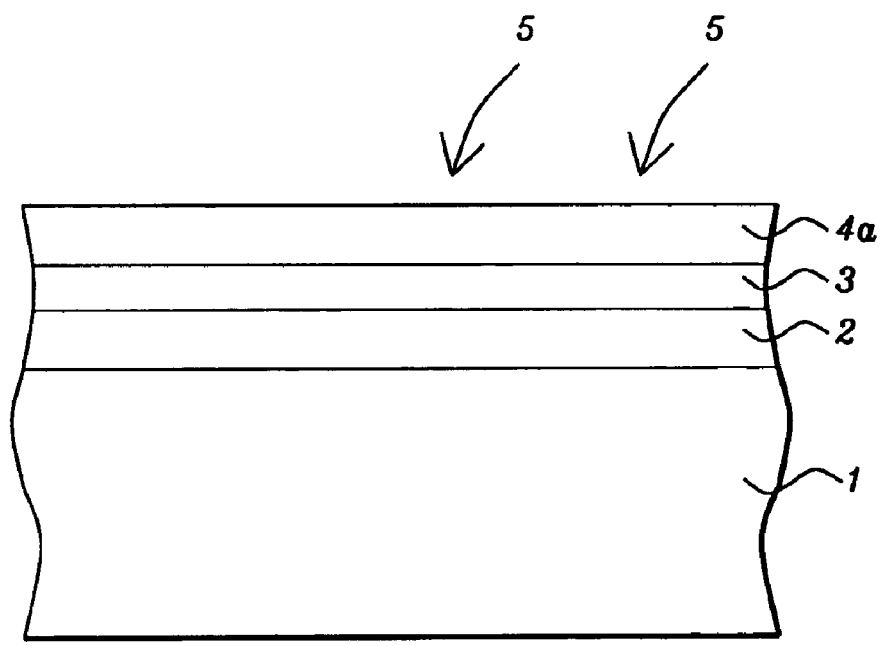
FIGS. 6–7, which schematically, in cross-sectional style, describe key stages of fabrication for a second embodiment of this invention, in which a strained silicon layer is formed on a relaxed, low defect density semiconductor alloy layer, wherein the semiconductor alloy layer was subjected to an anneal procedure performed either during or after the epitaxial growth to reduce the defect density of the annealed semiconductor alloy layer.
Figure 7:
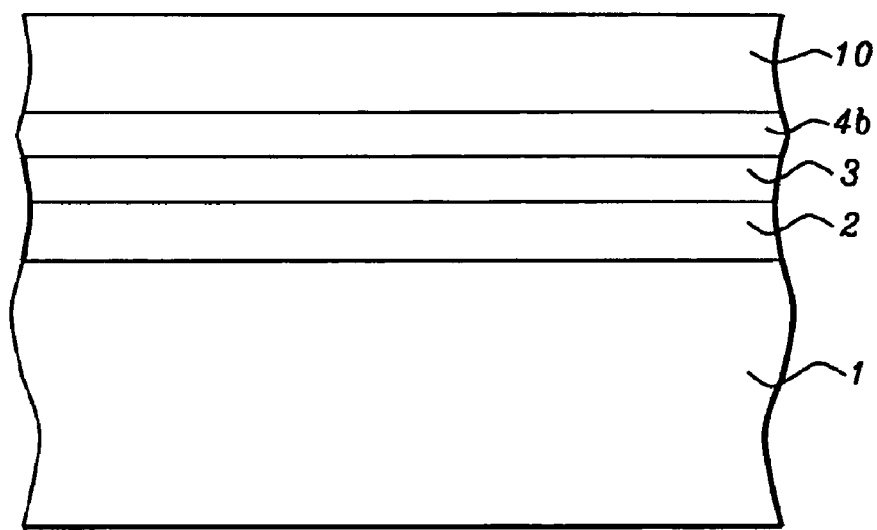

A second embodiment of this invention, the process of forming a strained silicon layer on a relaxed, low defect density semiconductor layer, is next addressed and schematically shown using FIGS. 6–7. Epitaxial growth of the identical composite layer described in the previous embodiment via growth conditions, and using thicknesses identical to those used and previously described for the first embodiment of this invention, is again performed, however for this case followed by an anneal procedure. The anneal procedure results in additional relaxation of the overlying, SiGe layer, as well as additional decreases in defect density of this layer, when compared to counterpart SiGe layers not subjected to the anneal procedure. Anneal procedure 5, can be performed to thin, strained SiGe layer 4a, at a stage prior to completing the entire epitaxial growth procedure, then followed by additional epitaxial growth resulting in relaxed, low defect density, SiGe layer 4b, as shown schematically in FIG. 6. If desired the anneal procedure can also be performed after the entire layer of the relaxed, low defect density layer has been realized. For either case the anneal procedure is performed in an inert ambient, at a temperature between about 800 to 1200° C., resulting in a final thickness for SiGe layer 4b, again between about 4000 Angstroms to several um. Critical, silicon layer 10, again the desired layer to be used to accommodate the channel region for subsequent CMOS devices, is next epitaxially grown, and schematically shown in FIG. 7. Silicon layer 10, is epitaxially grown using silane or disilane as a source. The thickness of silicon layer 10, is grown to a value less than it's critical thickness to maintain the desired strain in silicon layer 10. The ability to epitaxially grow strained silicon layer 10, with enhanced tensile strain, is enhanced via the additional relaxation and decreased defect density of annealed SiGe. This is schematically shown in FIG. 7.

Figure 8:
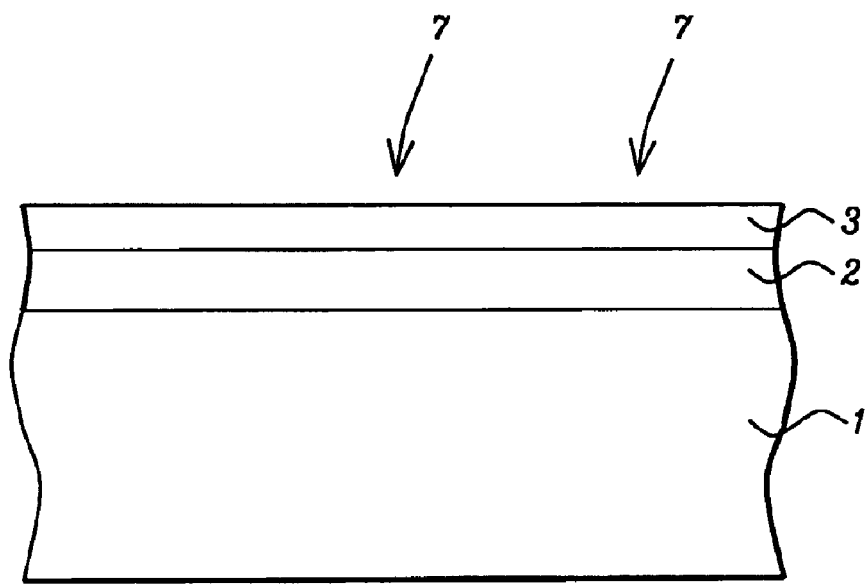
FIGS. 8–9, which schematically, in cross-sectional style, describe key stages of fabrication for a third embodiment of this invention, in which a silicon layer is subjected to ion implantation procedures to allow an overlying SiGe layer to be epitaxially grown, and now feature a defect density lower than defect densities of counterpart SiGe layers epitaxially grown on non-implanted silicon.
Figure 9:
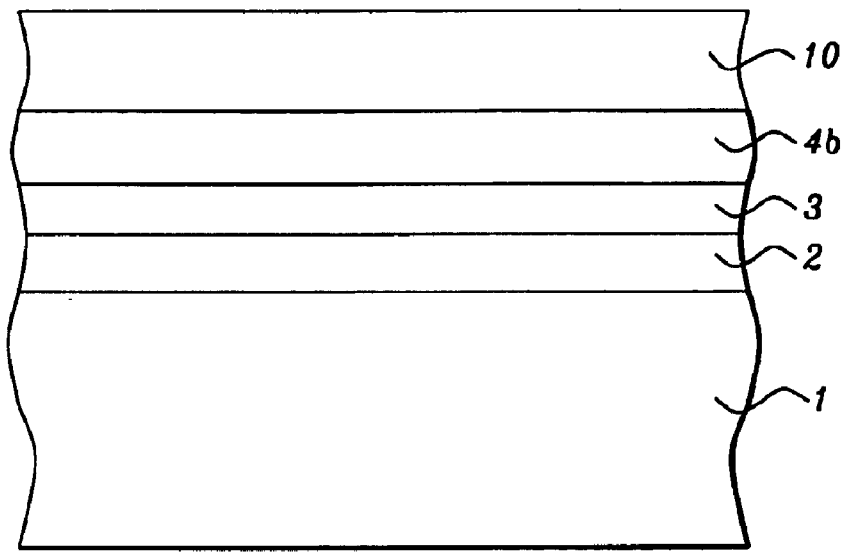

A third embodiment of this invention entails the use of ion implantation procedure 7, to weaken silicon layer 3, to allow overlying semiconductor alloy layer 4b, to be epitaxially grown again with increased relaxation and decreased defect density, when compared to counterpart layers formed on non-implanted, underlying silicon layers. The ability to obtain a relaxed, low defect density SiGe layer, improves the ability to subsequently grow a thin, strained silicon layer, under tensile strain. Growth of SiGe layer 4b, shown schematically in FIG. 8, featuring enhanced relaxation and low defect density, less than 1E3 defects/cm$^2$, as a result of epitaxial growth on an underlying, implanted silicon layer, is next accomplished at an identical thickness, as well as using identical process parameters, as used with counterpart SiGe layers described in the previous embodiments. The attainment of SiGe layer 4b, featuring the improved parameters, again allows the epitaxial growth of strained silicon layer 10, to be accomplished, wherein the critical thickness of strained silicon layer 10, is minimized to maintain strain, and to avoid relaxation. This is schematically shown in FIG. 9. If desired ion implantation procedure 7, can be applied to silicon layer 3, at some point after growth of an initial portion of strained layer 4b. This would be accomplished using an energy higher than the energy used for implantation prior to any growth of strained layer 4b.

Figure 10:
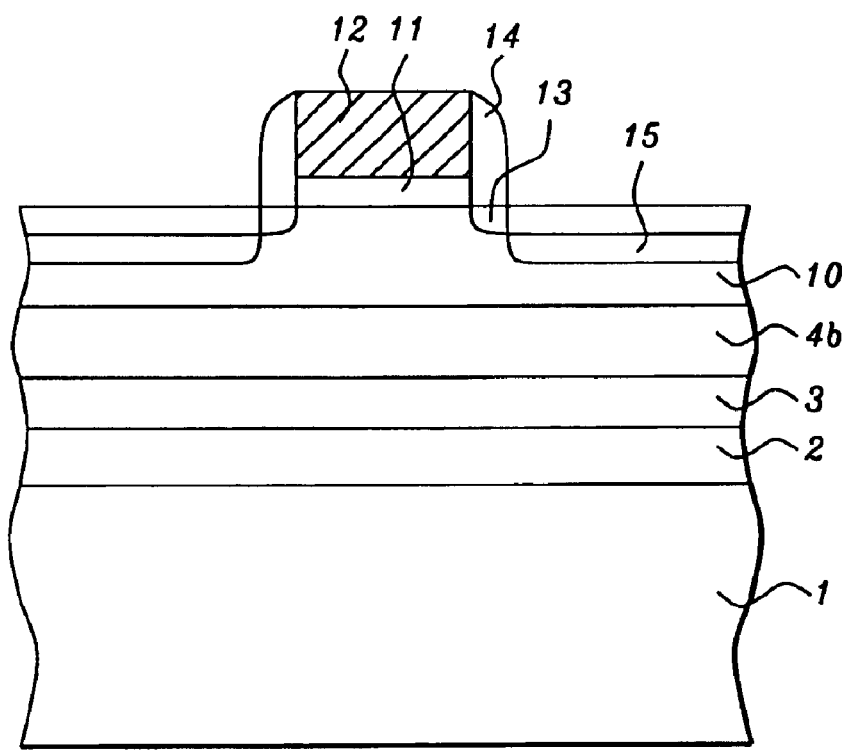
FIG. 10, which schematically, in cross-sectional style, describes a MOSFET device formed featuring a strained silicon layer.

The formation of a MOSFET device, with a channel region located in strained silicon layer 10, and with the leakage characteristics of the MOSFET device improved via formation on relaxed, low defect density, SiGe layer 4b, is next described and schematically shown in FIG. 10. Gate insulator layer 11, comprised of silicon dioxide is thermally grown in an oxygen stream ambient. A conductive layer, such as doped polysilicon or metal is deposited on gate insulator layer 11. Photolithographic and dry etching procedures are next employed to define conductive gate structure 12. If desired, lightly doped source/drain region 13, is formed in regions of silicon layer 10, not covered by conductive gate structure 12. Lightly doped source/drain region 13, is obtained via ion implantation procedures, using either N type ions if an N channel MOSFET is desired, or using P type ions is a P channel MOSFET device is needed.

Insulator spacers 14, such as silicon oxide or silicon nitride spacers, are formed on the sides of conductive gate structure 12, via deposition of the insulator layer followed by a blanket anisotropic dry etch procedure. Finally heavily doped source/drain region 15, obtained via implantation of either N type, or P type ions, is formed in a region of strained silicon layer 10, not covered by conductive gate structure 12, or by insulator spacers 14.

Although this invention has been described using a Si/SiGe combination, similar results can be obtained using a SiGe/SiGeC system, in which SiGe is an initially unstrained layer, converted to a strained layer via dislocation formation induced via growth of an overlying strained SiGeC layer, with the overlying SiGeC layer relaxing, and featuring a low defect density, after conversion the underlying SiGe layer. Other combination of materials offering the ability to create strained channel regions include elemental alloy, and compound semiconductors, (such as InGaAs/GaAs, AlGaAs/GaAs, and InGaN/GaN).

While this invention has been particularly shown and described with reference to, the preferred embodiments thereof, it will be understood by those skilled in the art that various changes in form and details may be made without departing from the spirit and scope of this invention.

What is claimed is:

1. A method of fabricating several crystalline layers on a crystalline substrate, comprising the steps of:

growing a first crystalline layer of a first natural crystal lattice constant that is different from the lattice constant of said crystalline substrate, on said crystalline substrate;

growing a second crystalline layer of a second natural constant that is different from the natural constant of said first crystalline layer, on said first crystalline layer; and growing a third low defect density crystalline layer of a third natural constant that is different from the natural constant of said second crystalline layer, on said second crystalline layer, so as to promote the creation of defects into at least said second crystalline layer, wherein the growth of an initial portion of said third low defect density crystalline layer results in a strained layer however becoming a relaxed layer during the growth of a final portion of said third low defect density crystalline layer, with the relaxation of said third low defect density crystalline layer resulting in defects and dislocations induced in said underlying, second crystalline layer.

2. The method of claim 1, further including growth of a strained thin fourth crystalline layer on said third low defect density crystalline layer of claim 1, wherein the natural lattice constant of said fourth crystalline layer is different from the natural lattice constant of said third low defect density crystalline layer.

3. The method of claim 1, wherein said crystalline substrate is an elemental semiconductor.

4. The method of claim 1, wherein said first crystalline layer is an elemental semiconductor.

5. The method of claim 1, wherein said second crystalline layer is an elemental semiconductor.

6. The method of claim 1, wherein said third low defect density crystalline layer is an elemental semiconductor.

7. The method of claim 1, wherein said fourth crystalline layer is an elemental semiconductor.

8. The method of claim 1, wherein the third low defect density crystalline layer is grown to a final thickness of between about 4000 Angstroms and several microns.

9. The method of claim 1, wherein the third low defect density crystalline layer has fewer than 1 E3 defects/$cm^2$.

10. The method of claim 1, wherein the second crystalline layer is less than approximately 500 Angstroms thick.

* * * * *